United States Patent
Lan et al.

(10) Patent No.: US 8,933,563 B2
(45) Date of Patent: Jan. 13, 2015

(54) THREE-DIMENSION CIRCUIT STRUCTURE AND SEMICONDUCTOR DEVICE

(75) Inventors: Wei-Chou Lan, Hsinchu (TW); Ted-Hong Shinn, Hsinchu (TW); Henry Wang, Hsinchu (TW); Chia-Chun Yeh, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 115 days.

(21) Appl. No.: 13/572,711

(22) Filed: Aug. 13, 2012

(65) Prior Publication Data

US 2013/0154015 A1    Jun. 20, 2013

(30) Foreign Application Priority Data

Dec. 16, 2011 (TW) .............................. 100146892 A

(51) Int. Cl.
*H01L 29/43* (2006.01)
*H01L 23/485* (2006.01)
*H01L 23/532* (2006.01)

(52) U.S. Cl.
USPC ............... 257/746; 738/610; 257/59; 257/72; 257/40; 257/43; 257/E33.053

(58) Field of Classification Search
CPC . H01L 29/49; H01L 29/4908; H01L 29/4232; H01L 29/4284; H01L 27/088; H01L 29/4966
USPC ............ 257/40, 746, E33.053, 72, 59, 43, 49, 257/50, 51, 52, 53, 54, 55, 56, 57, 58, 60, 257/61, 62, 63, 64, 65, 66, 67, 68, 69, 70, 257/71, 73, 74, 75; 438/610; 349/148, 147
See application file for complete search history.

(56) References Cited

U.S. PATENT DOCUMENTS

| | | | |
|---|---|---|---|
| 6,794,220 B2 * | 9/2004 | Hirai et al. ...................... 438/99 |
| 7,166,502 B1 | 1/2007 | Kwon | |
| 7,671,953 B2 | 3/2010 | Ha | |
| 7,759,738 B2 | 7/2010 | Kim et al. | |
| 7,826,021 B2 | 11/2010 | Ha | |
| 2003/0193624 A1 * | 10/2003 | Kobayashi et al. ............. 349/42 |
| 2005/0156163 A1 * | 7/2005 | Hirai ............................... 257/40 |
| 2005/0276912 A1 * | 12/2005 | Yamamoto et al. ........... 427/117 |
| 2006/0110580 A1 | 5/2006 | Aylward et al. | |
| 2006/0209222 A1 * | 9/2006 | Yasuda et al. ................... 349/43 |
| 2009/0039512 A1 | 2/2009 | Yang et al. | |
| 2009/0117333 A1 | 5/2009 | Lee et al. | |
| 2009/0181226 A1 | 7/2009 | Ning et al. | |
| 2009/0236627 A1 | 9/2009 | Kim et al. | |
| 2010/0261322 A1 | 10/2010 | Kim et al. | |
| 2012/0168201 A1 * | 7/2012 | Song et al. ................. 174/126.4 |

* cited by examiner

*Primary Examiner* — Matthew W Such
*Assistant Examiner* — Samuel Lair
(74) *Attorney, Agent, or Firm* — Jianq Chyun IP Office

(57) ABSTRACT

A three-dimension circuit structure includes a substrate, a first conductive layer, a filled material and a second conductive layer. The substrate has an upper surface and a cavity located at the upper surface. The first conductive layer covers the inside walls of the cavity and protrudes out the upper surface. The filled material fills the cavity and covers the first conductive layer. The second conductive layer covers the filled material and a portion of the first conductive layer, and the first conductive layer and the second conductive layer encapsulate the filled material. The material of the filled material is different from that of the first conductive layer and the second conductive layer.

14 Claims, 4 Drawing Sheets

THREE-DIMENSION CIRCUIT STRUCTURE AND SEMICONDUCTOR DEVICE

CROSS-REFERENCE TO RELATED APPLICATION

This application claims the priority benefit of Taiwan application serial no. 100146892, filed on Dec. 16, 2011. The entirety of the above-mentioned patent application is hereby incorporated by reference herein and made a part of this specification.

BACKGROUND OF THE INVENTION

1. Field of the Invention

The present invention relates to a circuit structure and a semiconductor device, in particular, to a three-dimension circuit structure and a semiconductor device using the three-dimension circuit structure.

2. Description of Related Art

In the current process technology of display, the size of the pixel unit must be reduced to increase the resolution of the panel. However, the size of the metal wire cannot be reduced due to the resistance; therefore, the metal wire still takes up much layout area in a reduced-size pixel unit, which greatly reduces the aperture ratio.

Moreover, in order to increase the size of the panel, the metal wire needs to be widened due to the resistance, and this design also has problems of taking up much layout area and reducing the aperture ratio. Besides, if the resistance of the metal wire is reduced by increasing the thickness of the metal wire, the substrate may be deformed because of the increased thickness of the metal wire, thereby affecting the reliability of the product. In addition, the increase of the thickness of the metal wire is also restricted by the process, and is not easy to achieve.

SUMMARY OF THE INVENTION

An embodiment of the present invention provides a three-dimension circuit structure, which includes a substrate, a first conductive layer, a filled material and a second conductive layer. The substrate has an upper surface and a cavity located at the upper surface. The first conductive layer covers the inside walls of the cavity and protrudes out the upper surface. The filled material fills the cavity and covers the first conductive layer. The second conductive layer covers the filled material and a portion of the first conductive layer, and the first conductive layer and the second conductive layer encapsulate the filled material, and the material of the filled material is different from that of the first conductive layer and the second conductive layer.

An embodiment of the present invention further provides a semiconductor device, which is disposed on a base plate. The semiconductor device includes a substrate, a first conductive layer, a filled material, a second conductive layer, a gate insulating layer, a semiconductor layer, a drain and a source. The substrate has an upper surface and a cavity located at the upper surface. The first conductive layer has a first conductive part disposed on a portion of the upper surface of the substrate and a second conductive part covering the inside walls of the cavity. The filled material fills the cavity and covers the second conductive part. The second conductive layer has a third conductive part covering the first conductive part and a fourth conductive part covering the filled material and a portion of the second conductive part, where the first conductive part and the third conductive part form a gate, and the second conductive part, the filled material and the fourth conductive part form a three-dimension circuit. The three-dimension circuit is connected to the gate. The gate insulating layer covers the three-dimension circuit and the gate. The semiconductor layer is disposed on the gate insulating layer. The drain is disposed on the semiconductor layer. The source is disposed on the semiconductor layer.

Based on the above, the design of the three-dimension circuit structure of the present invention saves the layout area of the conductive layer on the upper surface of the substrate by using the cavity, hence, the advantages of the three-dimension circuit structure of the present invention include a small line width and a small layout area.

In order to make the aforementioned features and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
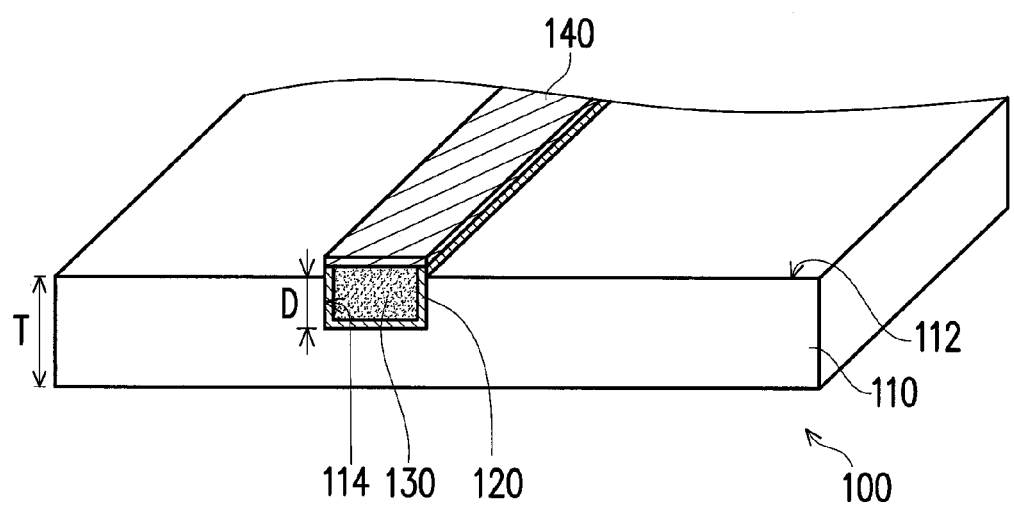
FIG. 1 is a local cross-sectional three-dimensional view of a three-dimension circuit structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a local cross-sectional three-dimensional view of a three-dimension circuit structure according to an embodiment of the present invention. Referring to FIG. 1, in this embodiment, a three-dimension circuit structure 100 includes a substrate 110, a first conductive layer 120, a filled material 130 and a second conductive layer 140.

More particularly, the substrate 110 has an upper surface 112 and a cavity 114 located at the upper surface 112. In this embodiment, the material of the substrate 110 is, for example, an organic material or an inorganic material, where the organic material is, for example, polyimide (PI) or polysiloxane (PSI), and the inorganic material is, for example, silicon-oxide (SiOx) or silicon-nitride (SiNx). Besides, the depth D of the cavity 114 is, for example, $1/10$ to $1/2$ of the thickness T of the substrate 110.

The first conductive layer 120 covers the inside walls of the cavity 114 of the substrate 110 and protrudes out the upper surface 112. The filled material 130 fills the cavity 114 of the substrate 110 and covers the first conductive layer 120. The second conductive layer 140 covers the filled material 130 and a portion of the first conductive layer 120. In particular, in this embodiment, the first conductive layer 120 and the second conductive layer 140 completely encapsulate the filled material 130, and the material of the filled material 130 is different from that of the first conductive layer 120 and the second conductive layer 140.

It should be noted that the filled material 130 of this embodiment may be, for example, the same material as that of the substrate 110, such as a non-conductive organic material, or the filled material 130 is, for example, a non-conductive polymer material. Certainly, the filled material 130 may also be a polymer material containing a plurality of metal particles or a plurality of non-metal particles, i.e., the filled material 130 has conductivity, where the material of the metal particles includes, for example, silver, and the material of the non-metal particles includes, for example, carbon. It needs to be explained that whether the filled material 130 has conductivity affects the resistance of the entire three-dimension circuit structure 100; when the filled material 130 has conductivity, compared with the non-conductive filled material 130, it can further reduce the resistance of the three-dimension circuit structure 100. In other words, the material type of the filled material 130 is not limited in this embodiment, and persons skilled in the art can select the material type of the filled material 130 according to actual needs for achieving required technical effects. Besides, the material of the first conductive layer 120 and the material of the second conductive layer 140 are, for example, metal (including molybdenum, chromium, aluminum or other proper materials) or alloy (MoCr or other proper materials), which are not limited herein. Moreover, the material of first conductive layer 120 may be the same as or different from that of the second conductive layer 140, which is not limited herein.

Since the substrate 110 of this embodiment is designed with the cavity 114, the layout area may be saved effectively without occupying the upper surface 112 of the substrate 110 and changing the surface area of the first conductive layer 120. In other words, the three-dimension circuit structure 100 of this embodiment may take up a small layout area. Moreover, the line width of the three-dimension circuit structure 100 of this embodiment is determined by the aperture of the cavity 114, so compared with the conductive layer with a large area disposed on the upper surface of the substrate in the prior art, the three-dimension circuit structure 100 of this embodiment may have a smaller line width. In other words, the advantages of the three-dimension circuit structure 100 of this embodiment include a small line width and a small layout area.

Figure 2A:
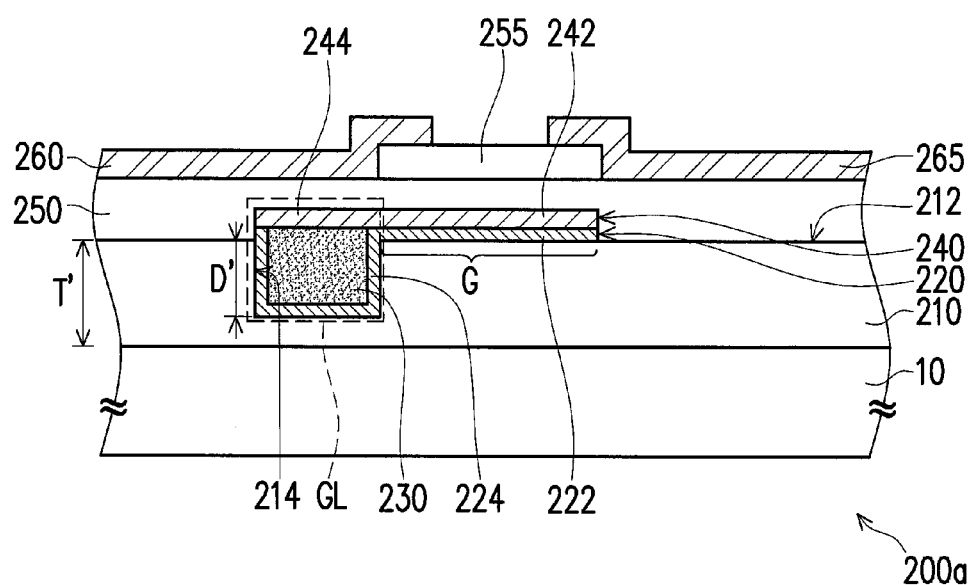
FIG. 2A is a schematic cross-sectional view of a semiconductor device according to an embodiment of the present invention.
Figure 2B:
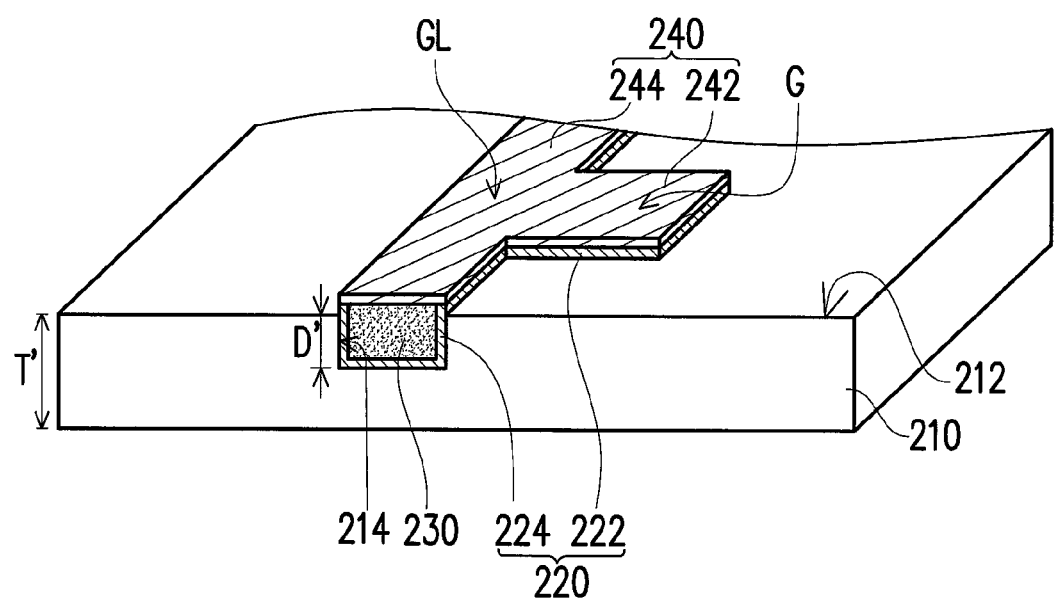
FIG. 2B is a schematic local cross-sectional three-dimensional view of a gate and a three-dimension circuit of the semiconductor device in FIG. 2A.

FIG. 2A is a schematic cross-sectional view of a semiconductor device according to an embodiment of the present invention. FIG. 2B is a schematic local cross-sectional three-dimensional view of a gate and a three-dimension circuit of the semiconductor device in FIG. 2A. Referring to FIG. 2A and FIG. 2B, the semiconductor device 200a of this embodiment is disposed on a base plate 10, and the semiconductor device 200a includes a substrate 210, a first conductive layer 220, a filled material 230, a second conductive layer 240, a gate insulating layer 250, a semiconductor layer 255, a source 260 and a drain 265. The semiconductor device 200a is an active device, for example, a thin film transistor.

More specifically, the substrate 210 has an upper surface 212 and a cavity 214 located at the upper surface 212. In this embodiment, the material of the substrate 210 is, for example, an organic material or an inorganic material, where the organic material is, for example, polyimide (PI) or polysiloxane (PSI), and the inorganic material is, for example, silicon-oxide (SiOx) or silicon-nitride (SiNx). Besides, the depth D' of the cavity 214 is, for example, 1/10 to 1/2 of the thickness T' of the substrate 210.

The first conductive layer 220 has a first conductive part 222 disposed on a portion of the upper surface 212 of the substrate 210 and a second conductive part 224 covering the inside walls of the cavity 214. The filled material 230 fills the cavity 214 and covers the second conductive part 224. The second conductive layer 240 has a third conductive part 242 covering the first conductive part 222 and a fourth conductive part 244 covering the filled material 230 and a portion of the second conductive part 224. Particularly, the first conductive part 222 and the third conductive part 242 form a gate G, and the second conductive part 224, the filled material 230 and the fourth conductive part 244 form a three-dimension circuit GL, where the three-dimension circuit GL is connected to the gate G, and the three-dimension circuit GL is, for example, a gate line. Besides, the gate insulating layer 250 of this embodiment covers the three-dimension circuit GL and the gate G, the semiconductor layer 255 is disposed on the gate insulating layer 250, and the source 260 and the drain 265 are disposed on two opposite sides of the semiconductor layer 255.

Here, the filled material 230 may be, for example, the same material as that of the substrate 210, such as a non-conductive organic material, or the filled material 230 is, for example, a non-conductive polymer material. Certainly, the filled material 230 may also be a polymer material containing a plurality of metal particles or a plurality of non-metal particles, i.e., the filled material 230 has conductivity, where the material of the metal particles includes, for example, silver, and the material of the non-metal particles includes, for example, carbon. It needs to be explained that whether the filled material 230 has conductivity affects the resistance of the entire three-dimension circuit GL; when the filled material 230 has conductivity, compared with the non-conductive filled material 230, it can further reduce the resistance of the three-dimension circuit GL. In other words, the material type of the filled material 230 is not limited in this embodiment, and persons skilled in the art can select the material type of the filled material 230 according to actual needs for achieving required technical effects. Besides, the material of the first conductive layer 220 and the material of the second conductive layer 240 are, for example, metal (including molybdenum, chromium, aluminum or other proper materials) or alloy (MoCr or other proper materials), which are not limited herein. Moreover, the material of first conductive layer 220 may be the same as or different from that of the second conductive layer 240, which is not limited herein.

Since the substrate 210 of this embodiment is designed with the cavity 214, the layout area may be saved effectively without occupying the upper surface 212 of the substrate 210 and changing the surface area of the first conductive layer 220. In other words, the three-dimension circuit GL of this embodiment may take up a small layout area. As a result, the saved area can be used for disposing other devices (not shown), and the application scope of the semiconductor device 200a can be expanded. Moreover, the line width of the three-dimension circuit GL of this embodiment is determined by the aperture of the cavity 214, so compared with the conductive layer with a large area disposed on the upper surface of the substrate in the prior art, the three-dimension circuit GL of this embodiment may have a smaller line width.

Figure 3:
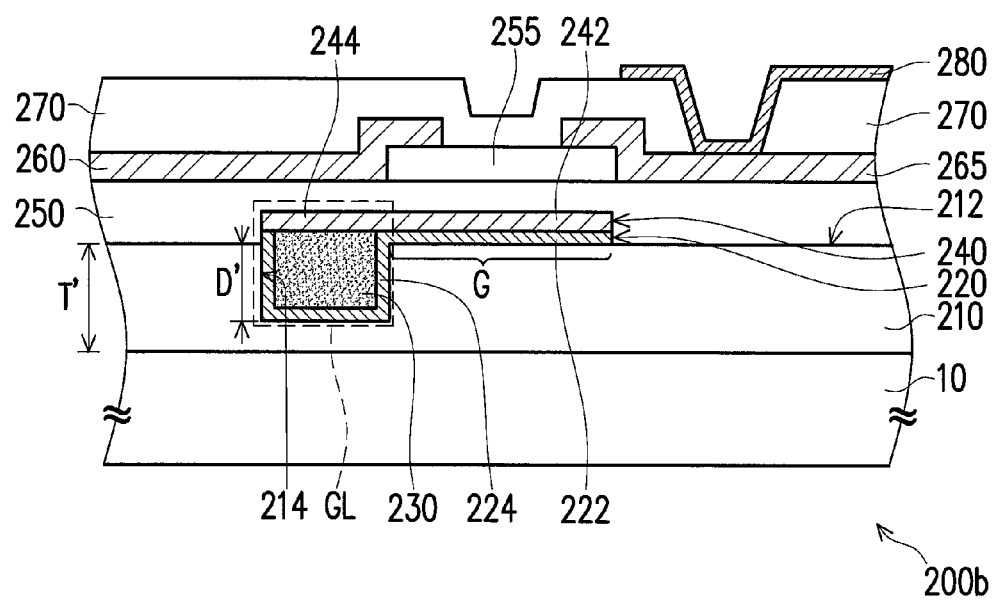
FIG. 3 is a schematic cross-sectional view of a semiconductor device according to another embodiment of the present invention.

FIG. 3 is a schematic cross-sectional view of a semiconductor device according to another embodiment of the present invention. The reference numbers and some content of the previous embodiments are still used in this embodiment, and the same reference numbers are used to indicate the same or similar components, with the explanation of the same technical contents being omitted. The omitted portions are as described in the previous embodiments, and will not be described again here. Referring to FIG. 3, the semiconductor device 200b of this embodiment is similar to the semiconductor device 200a in FIG. 2A, and the major difference lies in: the semiconductor device 200b of this embodiment is a pixel structure.

More specifically, the semiconductor device 200b of this embodiment further includes a protective layer 270 and a pixel electrode 280. The protective layer 270 is disposed on the substrate 210 and covers the semiconductor layer 255, the source 260 and the drain 265, and the protective layer 270 has an opening exposing a portion of the drain 265. The pixel electrode 280 is disposed on the substrate 210 and connected to the portion of the drain 265 exposed out of the protective layer 270 via the opening. Since the substrate 210 of this embodiment is designed with the cavity 214, the layout area may be saved effectively without occupying the upper surface 212 of the substrate 210 and changing the surface area of the first conductive layer 220. In other words, the three-dimension circuit GL of this embodiment may take up a small layout area. As a result, the saved area can be used for additional electrodes (not shown) for achieving the effect of increasing the aperture ratio.

To sum up, the design of the three-dimension circuit structure of the present invention saves the layout area of the conductive layer on the upper surface of the substrate by using a cavity. Therefore, the advantages of the three-dimension circuit structure of the present invention include a small line width and a small layout area.

Although the present invention is disclosed with reference to embodiments above, the embodiments are not intended to limit the present invention. Various variations and modifications can be made by persons skilled in the art without departing from the spirit and the scope of the present invention, so the protection scope of the present invention should be subject to what is defined in appended claims.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A three-dimension circuit structure, comprising:
   a substrate, having an upper surface and a cavity located at the upper surface;
   a first conductive layer, covering the inside walls of the cavity and protruding out the upper surface, such that a depth of the cavity is smaller than a height of the first conductive layer;
   a filled material, filling the cavity and covering the first conductive layer; and
   a second conductive layer, covering the filled material and a portion of the first conductive layer, wherein a surface of the second conductive layer away from the first conductive layer is not aligned with the upper surface of the substrate, the first conductive layer and the second conductive layer encapsulate the filled material, and the material of the filled material is different from that of the first conductive layer and the second conductive layer.

2. The three-dimension circuit structure according to claim 1, wherein the material of the substrate comprises an organic material or an inorganic material.

3. The three-dimension circuit structure according to claim 1, wherein the depth of the cavity is $1/10$ to $1/2$ of the thickness of the substrate.

4. The three-dimension circuit structure according to claim 1, wherein the filled material comprises an organic material, a polymer material or a polymer material containing a plurality of metal particles or a plurality of non-metal particles.

5. The three-dimension circuit structure according to claim 4, wherein the material of the metal particles comprises silver, and the material of the non-metal particle comprises carbon.

6. The three-dimension circuit structure according to claim 1, wherein the material of the first conductive layer and the material of the second conductive layer comprise metal or alloy.

7. A semiconductor device, disposed on a base plate, the semiconductor device comprising:
   a substrate, having an upper surface and a cavity located at the upper surface;
   a first conductive layer, having a first conductive part disposed on a portion of the upper surface of the substrate and a second conductive part covering the inside walls of the cavity;
   a filled material, filling the cavity and covering the second conductive part;
   a second conductive layer, having a third conductive part covering the first conductive part and a fourth conductive part covering the filled material and a portion of the second conductive part, wherein the first conductive part and the third conductive part form a gate, the second conductive part, the filled material and the fourth conductive part form a three-dimension circuit, and the three-dimension circuit is connected to the gate, wherein projections of the three-dimension circuit and the gate on the substrate are non-overlapping;
   a gate insulating layer, covering the three-dimension circuit and the gate;
   a semiconductor layer, disposed on the gate insulating layer;
   a drain, disposed on the semiconductor layer; and
   a source, disposed on the semiconductor layer.

8. The semiconductor device according to claim 7, wherein the material of the substrate comprises an organic material or an inorganic material.

9. The semiconductor device according to claim 7, wherein the depth of the cavity is $1/10$ to $1/2$ of the thickness of the substrate.

10. The semiconductor device according to claim 7, wherein the filled material comprises an organic material, a polymer material or a polymer material containing a plurality of metal particles or a plurality of non-metal particles.

11. The semiconductor device according to claim 10, wherein the material of the metal particles comprises silver, and the material of the non-metal particles comprises carbon.

12. The semiconductor device according to claim 7, wherein the material of the first conductive layer and the material of the second conductive layer comprise metal or alloy.

13. The semiconductor device according to claim 7, further comprising a protective layer disposed on the substrate and covering the semiconductor layer, the drain and the source, wherein a portion of the drain is exposed out of the protective layer.

14. The semiconductor device according to claim 13, further comprising a pixel electrode, disposed on the substrate and connected to the portion of the drain exposed out of the protective layer.

* * * * *